USOO6062879A

United States Patent [19]
Beaman et al.

[11] Patent Number: 6,062,879
[45] Date of Patent: *May 16, 2000

[54] HIGH DENSITY TEST PROBE WITH RIGID SURFACE STRUCTURE

[75] Inventors: Brian Samuel Beaman, Hyde Park; Keith Edward Fogel, Mohegan Lake; Paul Alfred Lauro, Nanuet; Maurice Heathcote Norcott, Fishkill; Da-Yuan Shih, Poughkeepsie, all of N.Y.

[73] Assignee: International Business Machines Corporation, Armonk, N.Y.

[*] Notice: This patent is subject to a terminal disclaimer.

[21] Appl. No.: 09/078,174

[22] Filed: May 13, 1998

Related U.S. Application Data

[62] Division of application No. 08/641,667, May 1, 1996, Pat. No. 5,785,538.
[60] Provisional application No. 60/007,576, Nov. 27, 1995.
[51] Int. Cl.[7] ..................................... H01R 4/04
[52] U.S. Cl. ............................. 439/91; 439/66
[58] Field of Search ................. 439/91, 86, 66, 439/59–65, 74, 71, 85

[56] References Cited

U.S. PATENT DOCUMENTS

| 4,548,451 | 10/1985 | Benarr et al. | 439/85 |
| 5,385,477 | 1/1995 | Vaynkof et al. | 439/66 |
| 5,531,022 | 7/1996 | Beaman et al. | 439/66 |
| 5,733,640 | 3/1998 | Horiuchi et al. | 439/91 |
| 5,810,607 | 9/1998 | Shih et al. | 439/66 |

*Primary Examiner*—Paula Bradley
*Assistant Examiner*—Tho D. Ta
*Attorney, Agent, or Firm*—Daniel P. Morris

[57] ABSTRACT

The present invention is a structure for probing an electronic device. The structure has a layer of elastomeric material having a first side and a second side; a plurality of electrical conductors extending from the first side to the second side; each of the electrical conductors has a first end and a second end, the first end extends to the first side, the second end extends to said second side; a layer of dielectric material disposed on the first side; the first end of the plurality of electrical conductors extends into openings in the layer of dielectric material. More particularly, in the present invention, the second side is disposed in contact with a first surface of a substrate and the second ends of the electrical conductors are electrically connected to first electrical contact locations on the first surface.

7 Claims, 7 Drawing Sheets

HIGH DENSITY TEST PROBE WITH RIGID SURFACE STRUCTURE

This is division of application Ser. No. 08/641,667, filed May 1, 1996 now U.S. Pat. No. 5,785,538 also claims provisional No. 60/007,576 filed Nov. 27, 1995.

FIELD OF THE INVENTION

The present invention is directed to probe structures for testing of electrical interconnections to integrated circuit devices and other electronic components and particularly to testing integrated circuit devices with bond pad interconnections.

BACKGROUND OF THE INVENTION

Integrated circuit (IC) devices and other electronic components are normally tested to verify the electrical function of the device and certain devices require high temperature burn-in testing to accelerate early life failures of these devices. The interconnection methods used to test IC devices with aluminum bond pads include permanent and disconnectable techniques. The permanent techniques that are typically used include wire bonding to provide a connection from the IC device to a substrate with fan out wiring or a metal lead frame package. The disconnectable techniques include rigid and flexible probes that are used to connect the IC device to a substrate with fan out wiring or directly to the test equipment.

The permanent attachment techniques used for testing integrated circuit devices such as wire bonding to a leadframe of a plastic leaded chip carrier are typically used for devices that have low number of interconnections and the plastic leaded chip carrier package is relatively inexpensive. The device is tested through the wire bonds and leads of the plastic leaded chip carrier and plugged into a test socket. If the integrated circuit device is defective, the device and the plastic leaded chip carrier are discarded.

The most cost effective techniques for testing and burn-in of integrated circuit devices provide a direct interconnection between the aluminum bond pads on the device to a disconnectable probe sockets that is hard wired to the test equipment. Contemporary probes for testing integrated circuits are expensive to fabricate and are easily damaged. The individual probes are typically attached to a ring shaped printed circuit board and support cantilevered metal wires extending towards the center of the opening in the circuit board. Each probe wire must be aligned to a contact location on the integrated circuit device to be tested. The probe wires are generally fragile and easily deformed or damaged. This type of probe fixture is typically used for testing integrated circuit devices that have aluminum bond pads along the perimeter of the device. This type of probe cannot be used for testing integrated circuit devices that have high density area array bond pads.

Another technique used for testing IC devices comprises a thin flex circuit with metal bumps and fan out wiring. The bumps are typically formed by photolithographic processes and provide a raised contact for the probe assembly. The bumps are used to contact the flat or recessed aluminum bond pads on the IC device. An elastomer pad is typically used between the back of the flex circuit and a pressure plate or rigid circuit board to provide compliance for the probe interface. This type of probe is limited to flexible film substrate materials that typically have one or two wiring layers. Also, this type of probe does not provide a wiping contact interface to ensure a low resistance connection.

The aluminum bond pads on a high density IC device are typically rectangular in shape and are recessed slightly below the surface of the passivation layer. If the wiping action of the high density probe is not controlled, the probe contact may move in the wrong direction and short to an adjacent aluminum bond pad or the probe contact may move off of the aluminum bond pad onto the surface of the passivation layer and cause an open connection.

OBJECTS

It is the object of the present invention to provide a probe for testing integrated circuit devices and other electronic components that use aluminum bond pads for the interconnection means.

Another object of the present invention is to provide a probe that is an integral part of the fan out wiring on the test substrate or other printed wiring means to minimize the contact resistance of the probe interface.

A further object of the present invention is to provide a probe with a compliant interface to compensate for slight variations in the aluminum bond pad heights on the IC device and variations in the height of the probe contacts.

An additional object of the present invention is to provide a probe with a wiping contact interface where the directing and length of the contact wipe is controllable.

SUMMARY OF THE INVENTION

A broad aspect of the present invention is a structure for probing an electronic device. The structure has a layer of elastomeric material having a first side and a second side; a plurality of electrical conductors extending from the first side to the second side; each of the electrical conductors has a first end and a second end, the first end extends to the first side, the second end extends to said second side; a layer of dielectric material disposed on the first side; the first end of the plurality of electrical conductors extends into openings in the layer of dielectric material.

In a more particular aspect of the present invention, the second side is disposed in contact with a first surface of a substrate and the second ends of the electrical conductors are electrically connected to first electrical contact locations on the first surface.

BRIEF DESCRIPTION OF THE DRAWINGS

These and other objects, features, and advantages of the present invention will become apparent upon further consideration of the following detailed description of the invention when read in conjunction with the drawing figures, in which.

DETAILED DESCRIPTION OF THE INVENTION

Figure 1:
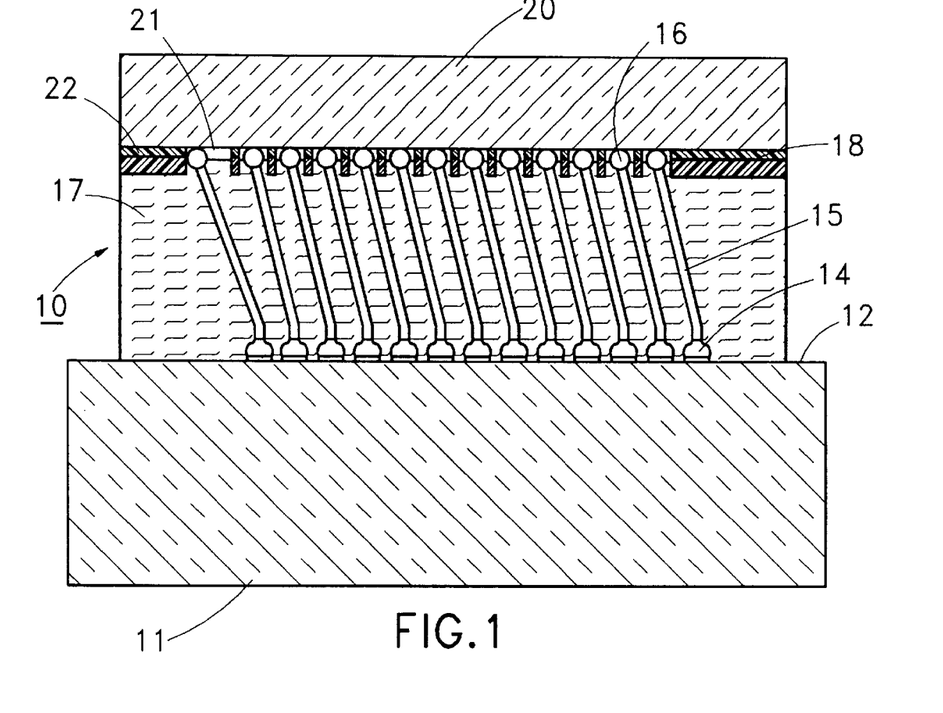
FIG. 1 shows a cross section of a high density test probe attached to a substrate and pressed against a bond pad on an integrated circuit device.

FIG. 1 shows a cross section of a test substrate (11) and high density probe (10) according to the present invention. The test substrate (11) provides a rigid base for attachment of the probes (10) and fan out wiring from the high density array of probe contacts to a larger grid of pins or other interconnection means to the equipment used to electrically test the integrated circuit device. The fan out substrate can be made from various materials and constructions including single and multi-layer ceramic with thick or thin film wiring, silicon wafer with thin film wiring, or epoxy glass laminate construction with high density copper wiring. The high density probes (10) are attached to the first surface (12) of the substrate (11). The probes are used to contact the bond pads (21) on the integrated circuit device (20). The bond pads (21) are typically recessed slightly below the surface of the passivation layer (22) of the integrated circuit device (20). The geometry of the high density probe (10) is optimized to provide a wiping contact interface to penetrate the oxides on the surface of the bond pads (21) to provide a low resistance connection.

Figure 2:
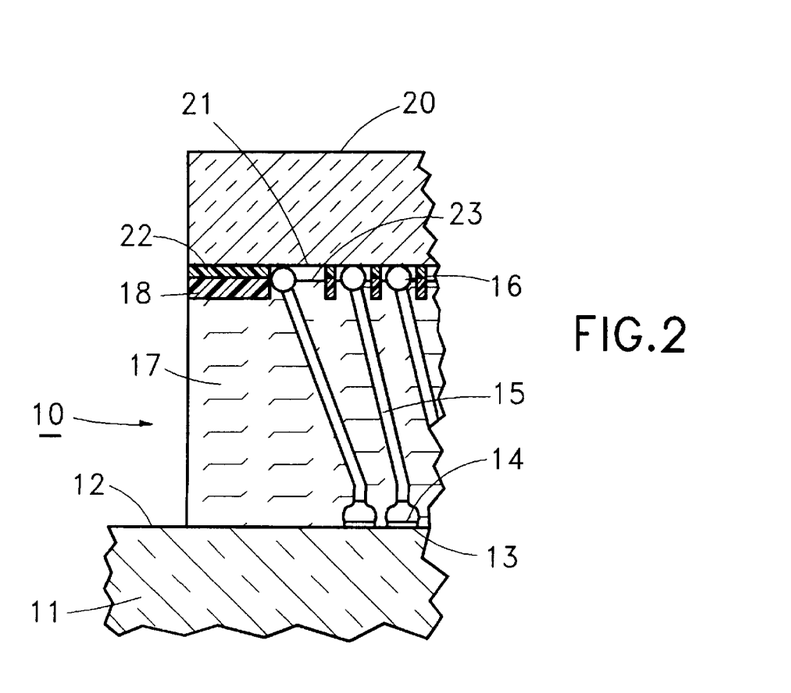
FIG. 2 shows an enlarged cross section of a high density test probe attached to a substrate and pressed against the bond pads on an integrated circuit device.

FIG. 2 shows an enlarged cross section of the high density probe (10). The high density probe (10) is attached directly to the fan out wiring (13) on the first surface (12) of the substrate (11) to minimize the resistance of the probe interface. The probe geometry is optimized to provide a flexible contact interface that controls the direction and length of the wiping action. The elastomer material (17) surrounding the probes provides a compliant structure and the polymer mask (18) with slotted openings (19) controls the direction and length that the probe tip (16) can wipe against the bond pads (21) on the IC device (20). As the high density probe (10) is pressed against the IC device (20), the polymer mask (18) presses against the layer of elastomeric material (17) and forces the ball shaped ends (16) of the probes through the slotted openings (19) in the polymer mask (18). The wiping action of the probe is caused by the ball shaped contact (16) pressing against and sliding along the surface (23) of the bond pad (21). The length of the wiping action is restricted by the size of the slotted hole (19) in the polymer mask (18).

Figure 3:
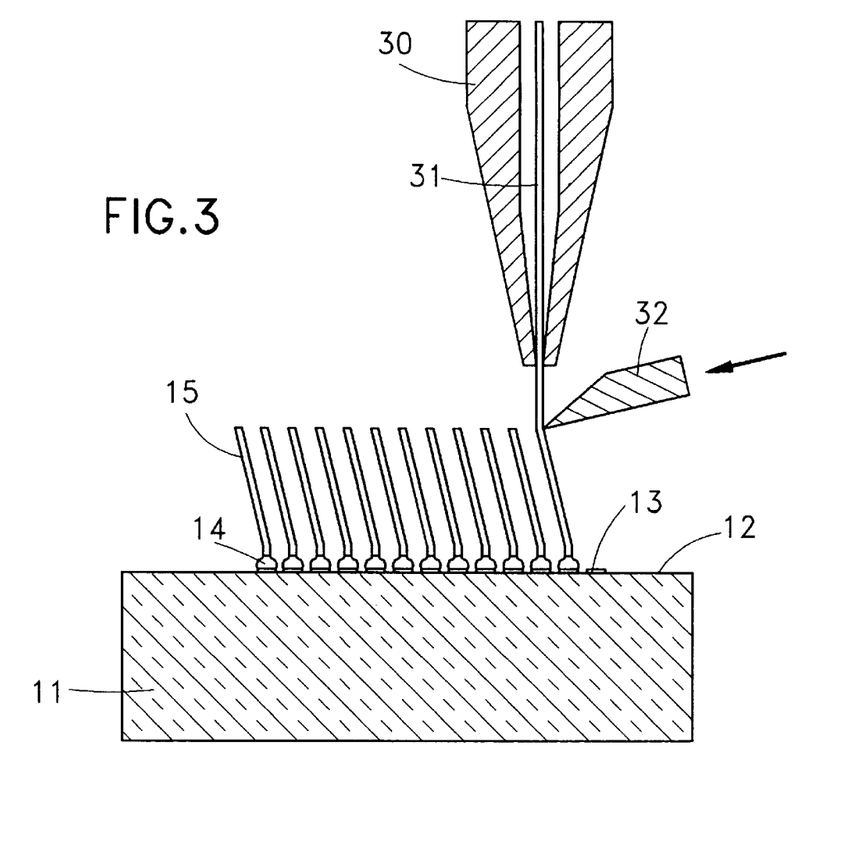
FIGS. 3–6 show the processes used to fabricate the high density probe on a fan out wiring substrate.

FIG. 3 shows the first process used to fabricate the high density probe. A thermosonic wire bonder tool is used to attach ball bonds (14) to the fan out wiring (13) on the first surface (12) of the rigid substrate (11). The wire bonder tool uses a first ceramic capillary (30) to press the ball shaped end of the bond wire (31) against the first surface (12) of the substrate (11). Compression force and ultrasonic energy are applied through the first capillary (30) tip and thermal energy is applied from the wire bonder stage through the substrate (11) to bond the ball shaped end of the bond wire (31) to the fan out wiring (13) on the first surface (12) of the substrate (11). The bond wire (31) is positioned at an angle and a shear blade (32) is used to sever the bond wire (31) to create an angled segment of wire (15) protruding vertically from the ball bond (14).

Figure 4:
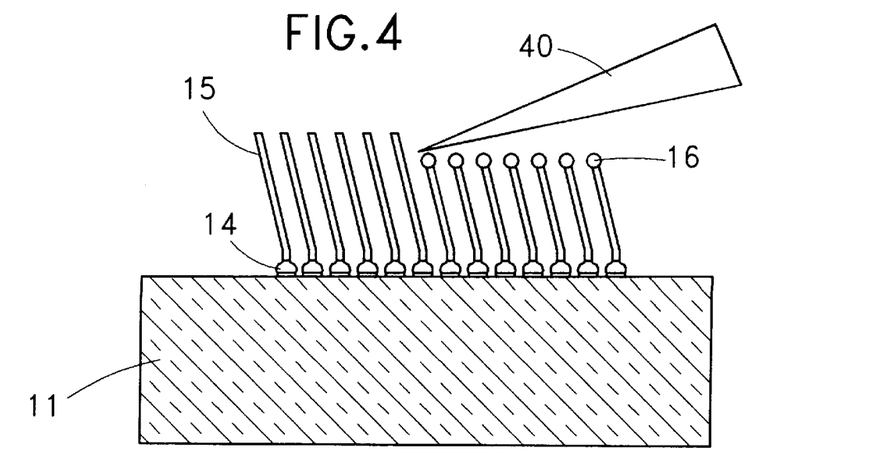

FIG. 4 shows an argon-ion laser (40) used to melt the ends of the angled wire segments (15) to create a ball shaped contact (16). The smooth surface of the ball shaped contact (16) is ideal for a wiping interface. The size of the ball shaped contact (16) on the end of the probe is controlled by the laser power density and the alignment of the focal point from the tip of the probe (15).

Figure 5:
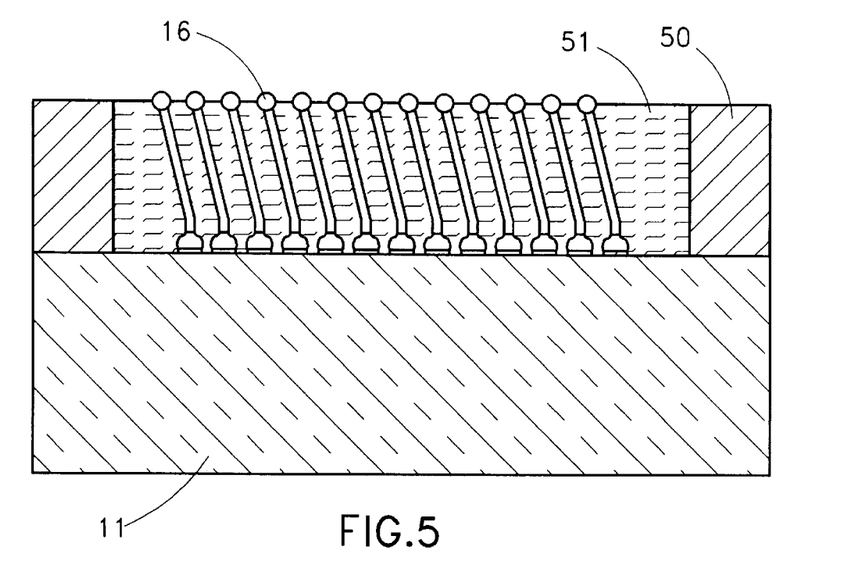
Figure 6:
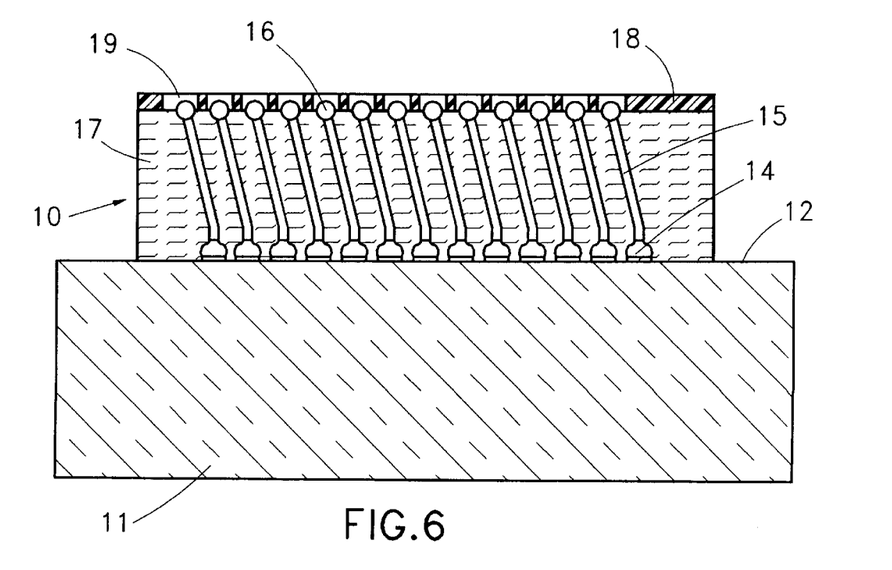

FIG. 5 shows a casting dam (50) placed around the array of high density probes. The casting dam (50) is used to contain the liquid elastomer (51) until it is cured. A controlled volume of liquid elastomer resin (51) is dispensed into the cavity and allowed to settle out before curing. Once the elastomer has cured, the casting dam (50) is removed and a polymer sheet (18) with slotted holes (19) is placed over the ball shaped ends (16) of the probes as shown in FIG. 6. An adhesion promoter can be used to attach the polymer sheet (18) to the layer of elastomeric material (17). The ball shaped ends (16) of the probes are recessed below the top surface of the polymer sheet (18) to protect the contact surface from damage while the probe is not used.

Figure 7:
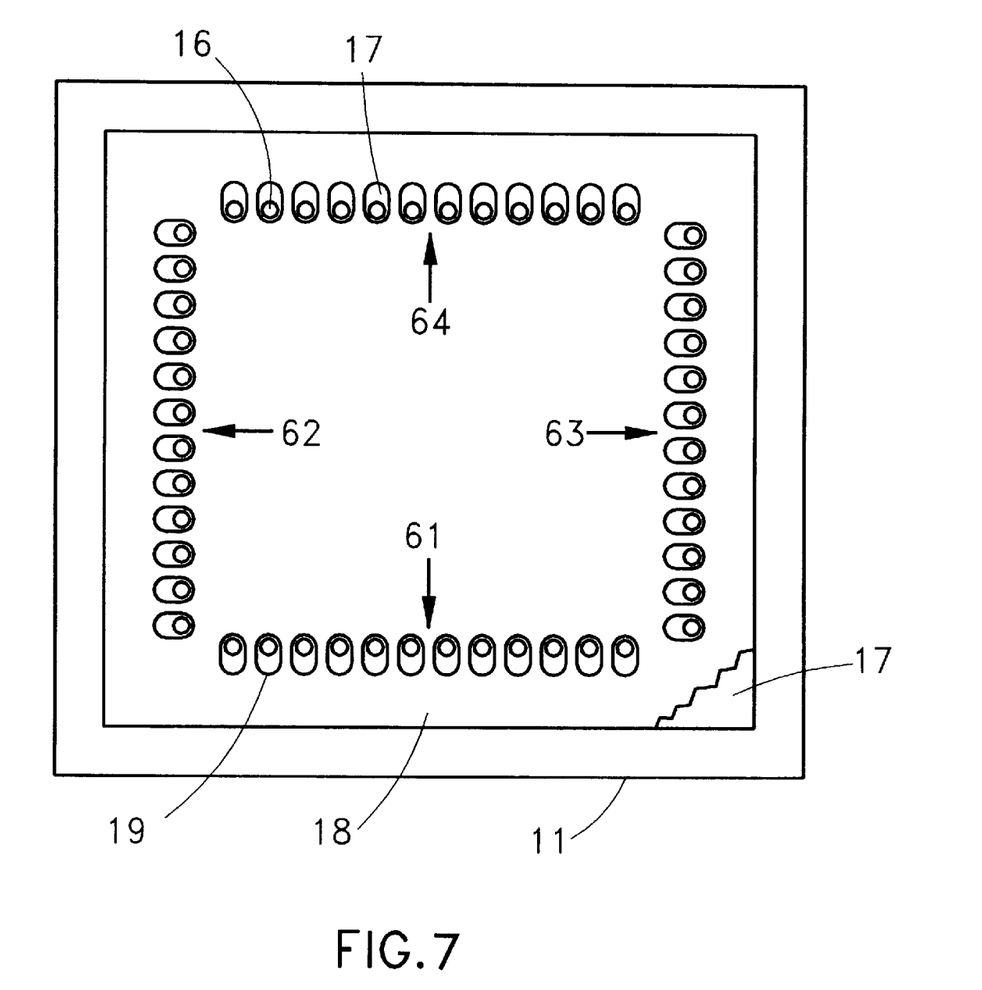
FIG. 7 shows a top view of the high density probe with controllable wipe.

FIG. 7 shows a top view of the high density probe and the slotted holes (19) in the polymer sheet (18) that is attached to the top of the lacer of elastomeric material (17). The slotted openings (19) in the polymer sheet (18) are aligned with the ball shaped ends (16) of the probes. The direction of the wiping action (61, 62, 63, 64) of the probes is controlled by the direction of the slotted holes. The wiping action of the ball shaped contacts can be controlled in opposite directions (61, 64) or in the same direction (62, 63). The accuracy of the location of the ball shaped probe contacts (16) is determined by the accuracy of the location of the slotted holes (19) in the polymer sheet (18). Also, the thermal coefficient of expansion (TCE) of the polymer sheet (18) can be selected to match the TCE of the IC device or other substrate material of the device to be tested at elevated temperatures.

Figure 8:
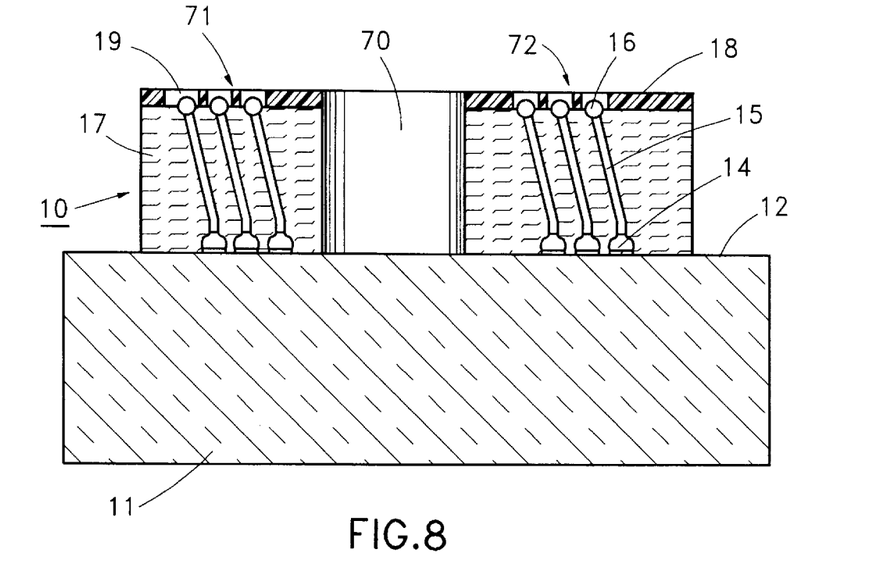
FIGS. 8 and 9 show additional embodiments of the high density probe with controlled wipe.

FIG. 8 shows another embodiment of the high density probe with a cavity or an aperture (70) in the layer of elastomeric material (17). The cavity (70) is typically located in the center of the array of peripheral contacts. The cavity (70) provides a means of controlling the radial forces that are generated in the elastomeric material (17) as it is compressed against the IC device. The radial forces can interfere with the wiping action of the probe against the IC device. The cavity (70) can also be used to decouple one array of probes (71) from an adjacent array of probes (72).

Figure 9:
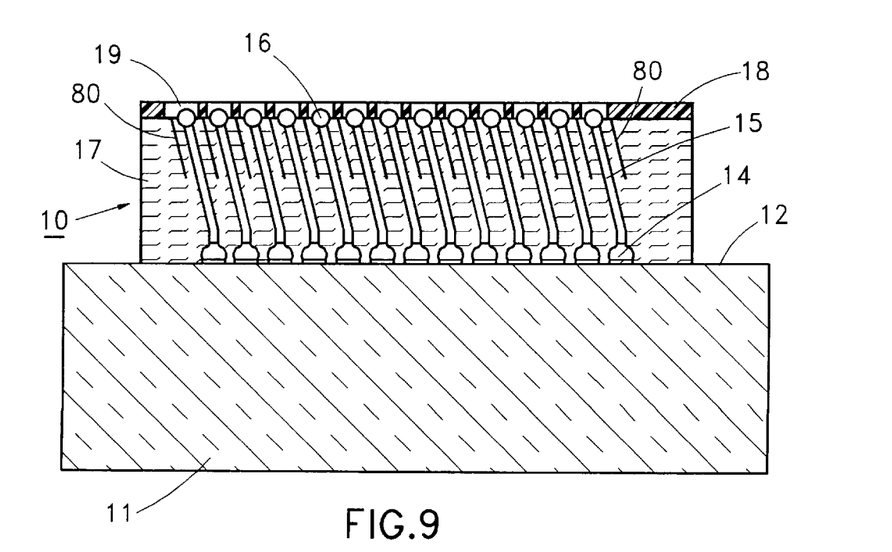

FIG. 9 shows another embodiment of the high density probe with slits or grooves (80) cut into the elastomeric material (17). The slits (80) are formed using a thin shear blade and are located between the rows of probe wires (15). The slits (80) are used to decouple the adjacent rows of probes.

Figure 10:
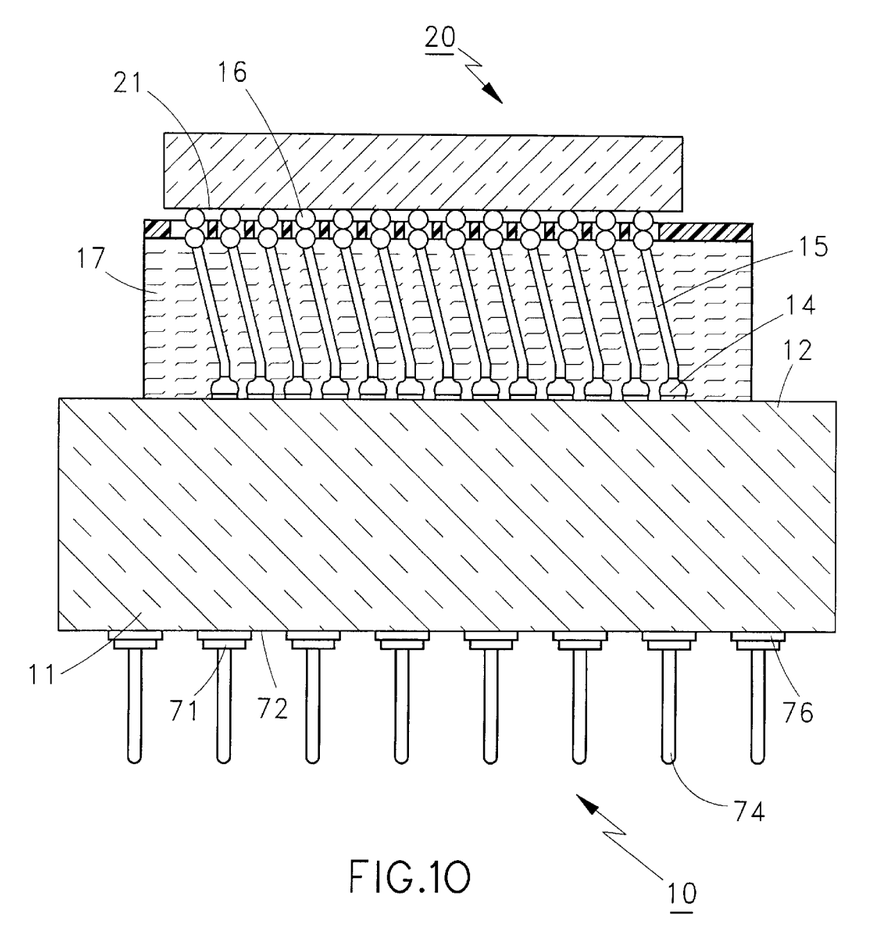
FIG. 10 shows the structure of FIG. 8 with pins for providing electrical signals to the probes.

FIG. 10 shows the structure of FIG. 8 with second contact locations (71) on surface (73) of substrate (11). Contact locations (71) can be the same as contact locations (13). FIG. 10 shows the structure of FIG. 8 with elongated conductors (74) such as pins fixed to the surface (76) of pad (71).

Figure 11:
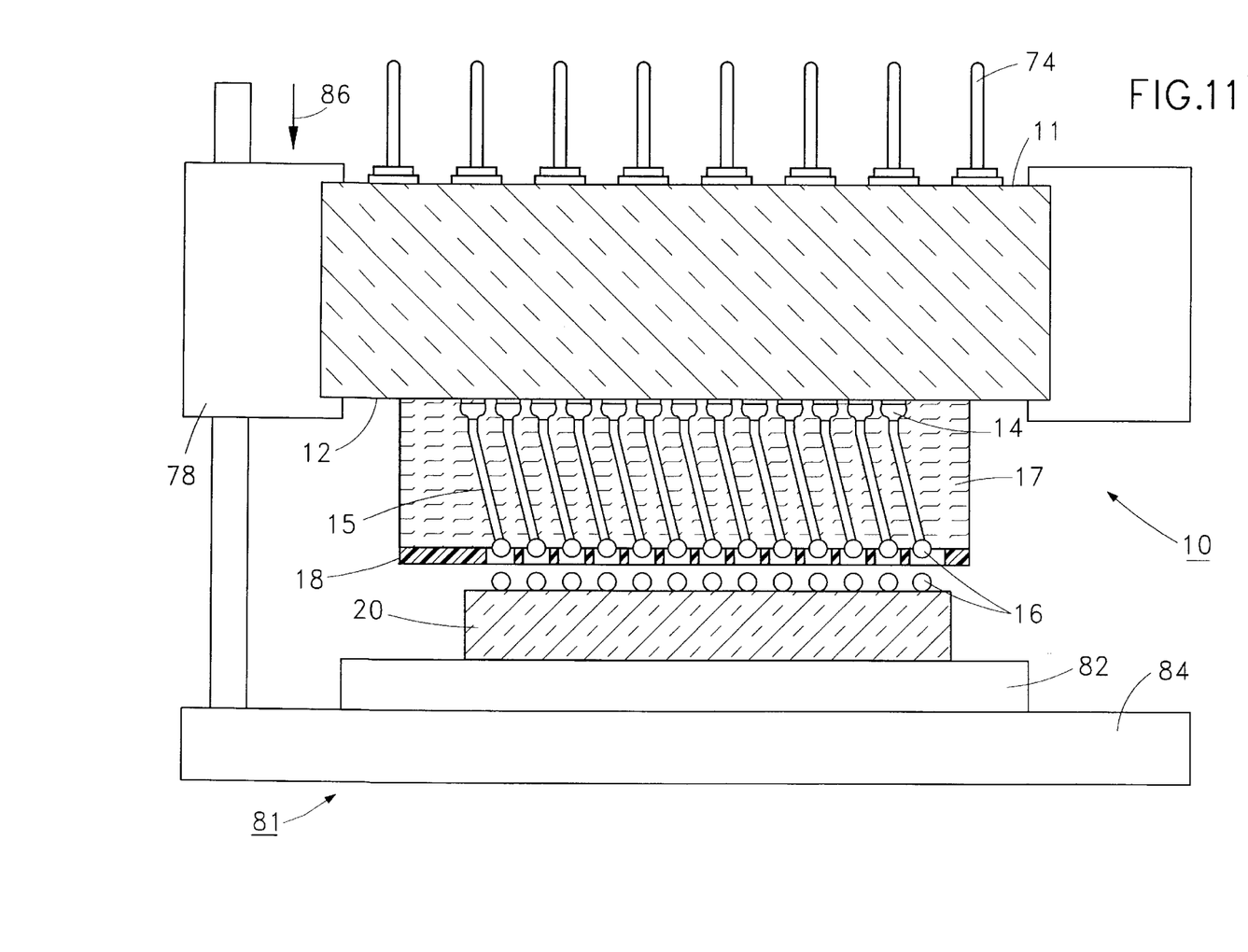
FIG. 11 shows the structure of FIG. 8 with a means for moving the probe into engagement with an electronic device.

FIG. 11 shows substrate (11) held by arm (78) of fixture (81). Work piece or IC device (20) is disposed on support (82) which is disposed in contact with fixture (81) by base (84). Arm (78) is adapted for movement as indicated by arrow (86) towards base (84), so that probe tips (16) are brought into engagement with conductors (22). An example of an apparatus providing a means for moving substrate (11) into engagement with work piece (20) can be found in U.S. Pat. No. 4,875,614.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A structure comprising:
   a layer of elastomeric material having a first side and a second side;
   a plurality of flexible electrical conductors extending from said first side to said second side;
   each of said electrical conductors has a first end and a second end, said first end extends to said first side, said second end extends to said second side;
   a layer of dielectric material disposed on said first side; said first end of said plurality of electrical conductors extends into openings in said layer of dielectric material; and
   an aperture in said layer of elastomeric material extending from said first side to said second side.

2. A structure according to claim 1, wherein there is a groove in said layer of elastomeric material at said first side between at least two of said electrical conductors.

3. A structure comprising:
   a layer of elastomeric material having a first side and a second side;
   a plurality of flexible electrical conductors extending from said first side to said second side;
   each of said electrical conductors has a first end and a second end, said first end extends to said first side, said second end extends to said second side;
   a layer of dielectric material disposed on said first side;
   said first end of said plurality of electrical conductors extends into openings in said layer of dielectric material;
   said second side is disposed in contact with a first surface of a substrate and said second ends of said electrical conductors are electrically connected to first electrical contact locations on said surface;
   said substrate has a second side, said second side has a plurality of second electrical contact locations thereon, which are in electrical communication with said first electrical contact locations.

4. A structure according to claim 3, further including pins electrical bond pads connected to said second contact locations.

5. A probe for making electrical contact with a plurality of bond pads on an integrated circuit device comprising:
   a first fan out substrate having a first surface;
   said first surface having a plurality of contact locations;
   a plurality of ball bonds attached to said plurality of contact locations;
   a plurality of wires extending outward from said ball bonds, away from said first surface on fan out substrate;
   a plurality of ball shaped contacts on the ends of said plurality of wires;
   a layer of elastomeric material surrounding said probes;
   a sheet of polymer material with a plurality of slotted openings corresponding to said plurality of ball shaped contacts.

6. A probe according to claim 5, further including a cavity in said layer of polymer material to decouple a first array of probes from a second array of probes.

7. A probe for making electrical contact with a plurality of bond pads on an integrated circuit device comprising:
   a first fan out substrate having a first surface;
   said first surface having a plurality of contact locations;
   a plurality of ball bonds attached to said plurality of contact locations;
   a plurality of wires extending outward from said ball bonds, away from said first surface on fan out substrate;
   a plurality of ball shaped contacts on the ends of said plurality of wires; a layer of elastomeric material surrounding said probes;
   a sheet of polymer material with a plurality of slotted openings corresponding to said plurality of ball shaped contacts; and
   a slit in said elastomeric material to decouple adjacent rows of probes.

* * * * *